United States Patent
Hao et al.

(10) Patent No.: US 10,108,046 B2
(45) Date of Patent: Oct. 23, 2018

(54) DISPLAY DEVICE AND SEMICONDUCTOR DEVICE CONTAINING THE SAME

(71) Applicant: BOE TECHNOLOGY GROUP CO., LTD, Beijing (CN)

(72) Inventors: Xueguang Hao, Beijing (CN); Hongfei Cheng, Beijing (CN); Yong Qiao, Beijing (CN); Xinyin Wu, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 15/501,209

(22) PCT Filed: Jul. 1, 2016

(86) PCT No.: PCT/CN2016/088178
§ 371 (c)(1),
(2) Date: Feb. 2, 2017

(87) PCT Pub. No.: WO2017/117935
PCT Pub. Date: Jul. 13, 2017

(65) Prior Publication Data
US 2018/0052366 A1 Feb. 22, 2018

(30) Foreign Application Priority Data
Jan. 6, 2016 (CN) .......................... 2016 1 0007256

(51) Int. Cl.
*H01J 1/62* (2006.01)
*G02F 1/1335* (2006.01)
(Continued)

(52) U.S. Cl.
CPC .. *G02F 1/133621* (2013.01); *G02F 1/133504* (2013.01); *G02F 1/133514* (2013.01); *H01L 27/32* (2013.01); *H01L 27/322* (2013.01); *H01L 27/3211* (2013.01); *H01L 33/06* (2013.01); *H01L 51/502* (2013.01); *H01L 51/5072* (2013.01); *H01L 51/5092* (2013.01); *H01L 51/52* (2013.01)

(58) Field of Classification Search
USPC ........................................ 313/506, 498, 504
See application file for complete search history.

(56) References Cited

U.S. PATENT DOCUMENTS

2007/0257609 A1 11/2007 Fukuda et al.
2009/0153972 A1 6/2009 Nakamura et al.

FOREIGN PATENT DOCUMENTS

CN 101766052 A 6/2010
CN 103730584 A 4/2014
(Continued)

OTHER PUBLICATIONS

The World Intellectual Property Organization (WIPO) International Search Report for PCT/CN2016/088178 dated Oct. 9, 2016 p. 1-13.
(Continued)

*Primary Examiner* — Vip Patel
(74) *Attorney, Agent, or Firm* — Anova Law Group, PLLC (57) ABSTRACT

The present disclosure provides a display device having a light-emitting side and a non-light-emitting side. The display device includes a light-emitting layer; and a quantum dot sealant layer on the light-emitting side of the display device. The quantum dot sealant layer includes red quantum dots for emitting red light.

19 Claims, 3 Drawing Sheets

(51) Int. Cl.
*H01L 51/52* (2006.01)
*H01L 27/32* (2006.01)
*H01L 33/06* (2010.01)
*H01L 51/50* (2006.01)

(56) References Cited

FOREIGN PATENT DOCUMENTS

| | | |
|---|---|---|
| CN | 203983339 U | 12/2014 |
| CN | 104330918 A | 2/2015 |
| CN | 104466026 A | 3/2015 |
| CN | 104536198 A | 4/2015 |
| CN | 104576703 A | 4/2015 |
| CN | 104752620 A | 7/2015 |
| CN | 105097879 A | 11/2015 |
| CN | 105609656 A | 5/2016 |

OTHER PUBLICATIONS

State Intellectual Property Office of the P.R.C (SIPO) Office Action 1 for 2016100072564 dated Feb. 15, 2017 10 Pages.

DISPLAY DEVICE AND SEMICONDUCTOR DEVICE CONTAINING THE SAME

CROSS-REFERENCES TO RELATED APPLICATIONS

This patent application is a national phase entry under 35 U.S.C. § 371 of International Application No. PCT/CN2016/088178, filed on Jul. 1, 2016, which claims priority to Chinese Patent Application No. 201610007256.4, filed on Jan. 6, 2016. The above enumerated patent applications are incorporated by reference herein in their entirety.

TECHNICAL FIELD

The present invention generally relates to the display technologies and, more particularly, relates to a display device and a semiconductor device containing the display device.

BACKGROUND

Full-color technologies applied on organic light-emitting diode (OLED) devices have advanced significantly. Common full-color technologies include the applications of multi-layered structures, color conversion, juxtaposed pixels, color filters, etc. To apply the color conversion method, light emitted by certain organic materials is used as excitation to excite color-converting materials for illuminating light with different colors, e.g., red, green, and blue. In this way, full-color light can be produced. To apply the color conversion method, color-converting materials need to be disposed into the OLED device. Under the excitation of the light emitted by the organic light-emitting materials, the color-converting materials generate light that radiates in various directions. A portion of the light emitted by the color-converting materials may also radiate on the side of the organic light-emitting materials that is not designed to be the light-emitting side. As a result, intensity and color saturation of the light emitted at the light-emitting side of the OLED device may be reduced. The light emission efficiency of the OLED device can be reduced or impaired.

BRIEF SUMMARY

The present disclosure provides a display device and a semiconductor device containing the display device. The disclosed display device may improve the intensity and the color saturation of the light emitted at the light-emitting side display device can be improved. The light emission efficiency of the display device can be improved.

One aspect of the present disclosure includes a display device having a light-emitting side and a non-light-emitting side. The display device includes a light-emitting layer; and a quantum dot sealant layer on the light-emitting side of the display device. The quantum dot sealant layer includes red quantum dots for emitting red light.

Optionally, the display device further includes a first electrode and a substrate. The first electrode is on the non-light-emitting side, the substrate is on the light-emitting side, and the quantum dot sealant layer is between the light-emitting layer and the substrate.

Optionally, the light-emitting layer includes at least one blue light-emitting units for emitting blue light and at least one green light-emitting units for emitting green light, the blue light, the green light, and the red light forming full-color light on the light-emitting side.

Optionally, the quantum dot sealant layer covers the light-emitting layer.

Optionally, the red quantum dots absorb at least one of blue light and green light for emitting red light.

Optionally, the light-emitting layer includes at least one blue light-emitting unit for emitting blue light; and the quantum dot sealant layer further includes green quantum dots for emitting green light, the blue light, the green light, and the red light forming full-color light on the light-emitting side.

Optionally, the light-emitting layer includes at least one green light-emitting unit for emitting green light; and the quantum dot sealant layer further includes blue quantum dots for emitting blue light, the blue light, the green light, and the red light forming full-color light on the light-emitting side.

Optionally, the green quantum dots absorb blue light to emit green light; and the red quantum dots absorb at least blue light for emitting red light.

Optionally, the blue quantum dots absorb green light to emit blue light; and the red quantum dots absorb at least green light for emitting red light.

Optionally, the display device further includes a dual brightness enhancement film between the light-emitting layer and the quantum dot sealant layer, the dual brightness enhancement film including light-refracting layer, a light-scattering layer, and a light-condensing layer. The light-refracting layer transmits light emitted by the light-emitting layer through and reflects light emitted by the quantum dot sealant layer. The light-scattering layer scatters light transmitted through the light-refracting layer, the light-scattering layer being disposed on a side of the light-refracting layer that is facing away from the light-emitting layer. The light-condensing layer condenses light transmitted through the light-scattering layer, the light-condensing layer being disposed on a side of the light-scattering layer that is facing the quantum dot sealant layer.

Optionally, the light-emitting layer is made of an organic light-emitting material.

Optionally, the light-emitting layer is made of an inorganic light emitting material.

Optionally, the first electrode is made of a material that is optically transparent and electrically conductive.

Optionally, light emitted by a light-emitting unit and transmitting through a corresponding location of the quantum dot sealant layer without a quantum dot maintains color when passing through the quantum dot sealant layer.

Optionally, the red quantum dots are made of one or more of: ZnSSe, ZnSeTc, ZnSTe, CdSSe, CdSeTe, CdSTe, HgSSe, HgSeTe, HgSTe, ZnCdS, ZnCdSe, ZnCdTe, ZnHgS, ZnHgSe, ZnHgTe, CdHgS, CdHgSe, CdHgTe, ZnCdSSe, ZnHgSSe, ZnCdSeTe, ZnHgSeTe, CdHgSSe, CdHgSeTe, CdS, CdSe, CdTe, ZnS, ZnSe, and ZnTe.

Optionally, the green quantum dots are made of one or more of: ZnSSe, ZnSeTe, ZnSTe, CdSSe, CdSeTe, CdSTe, HgSSe, HgSeTe, HgSTe, ZnCdS, ZnCdSe, ZnCdTe, ZnHgS, ZnHgSe, ZnHgTe, CdHgS, CdHgSe, CdHgTe, ZnCdSSe, ZnHgSSe, ZnCdSeTe, ZnHgSeTe, CdHgSSe, CdHgSeTe, CdS. CdSe, CdTe, ZnS, ZnSe, and ZnTe.

Optionally, the dual brightness enhancement film is made of an organic material.

Another aspect of the present disclosure provides a semiconductor device, including one or more of the disclosed display devices.

Other aspects of the present disclosure can be understood by those skilled in the an in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

The present disclosure provides a display device and a semiconductor device containing the display device. The display device may include a quantum dot sealant layer and a dual brightness enhancement film. The display device may include a first electrode, an organic light-emitting layer, a second electrode, a quantum dot sealant layer disposed on the light-emitting side of the organic light-emitting layer, and a dual brightness enhancement film disposed between the quantum dot sealant layer and the organic light-emitting layer. The organic light-emitting layer may be positioned between the first electrode and the second electrode.

In embodiments of the present disclosure, the dual brightness enhancement film may be used to allow the light emitted by the organic light-emitting layer to pass through and enable the light emitted by the quantum dots in the quantum dot sealant layer to undergo a full reflection. The organic light-emitting layer includes a plurality of light-emitting units. The quantum dots formed in the quantum dot sealant layer may emit light of complementary colors when being excited by the light emitted by the light-emitting units. The dual brightness enhancement film may allow the light emitted by the organic light-emitting layer to pass through and enable the light emitted by the quantum dots in the quantum dot sealant layer that radiates towards the organic light-emitting layer, to undergo a full reflection. The light emitted by the organic light-emitting layer and the light of complementary colors, emitted by the quantum dots in the quantum dot sealant layer, may transmit to the light-emitting side of the display device. The light of complementary colors may mix with the light emitted by the light-emitting units to form full-color light. The intensity and color saturation of the light emitted at the light-emitting side of the display device can thus be increased or improved. The light emission efficiency can be improved.

One aspect of the present disclosure provides a display device.

Figure 1:
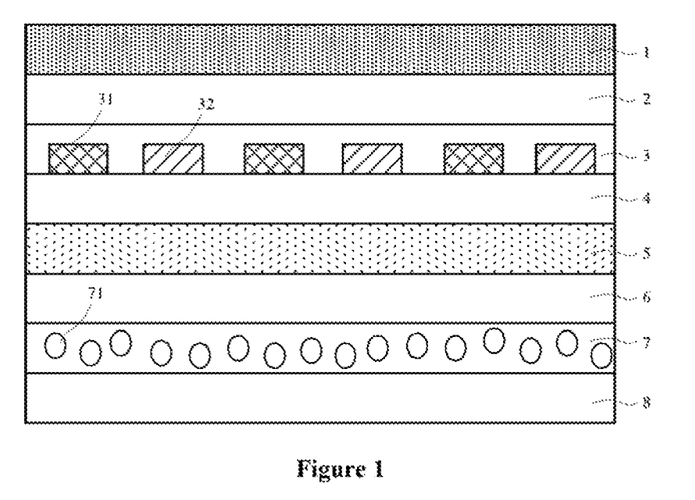
FIG. 1 illustrates an exemplary display device according to various disclosed embodiments of the present disclosure.
Figure 2:
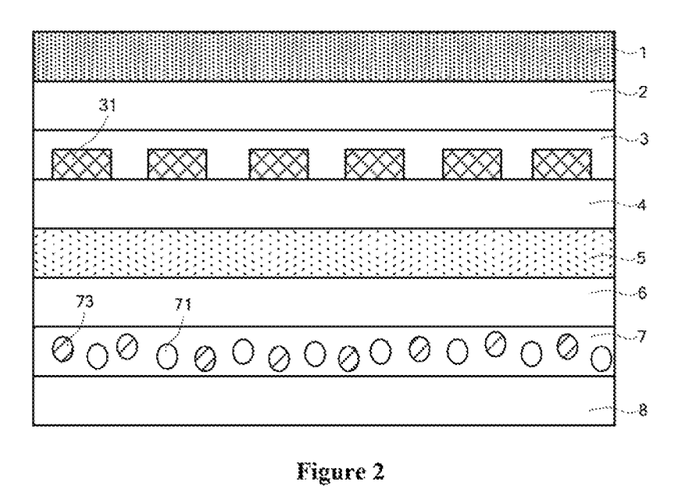
FIG. 2 illustrates another exemplary display device according to various disclosed embodiments of the present disclosure.
Figure 3:
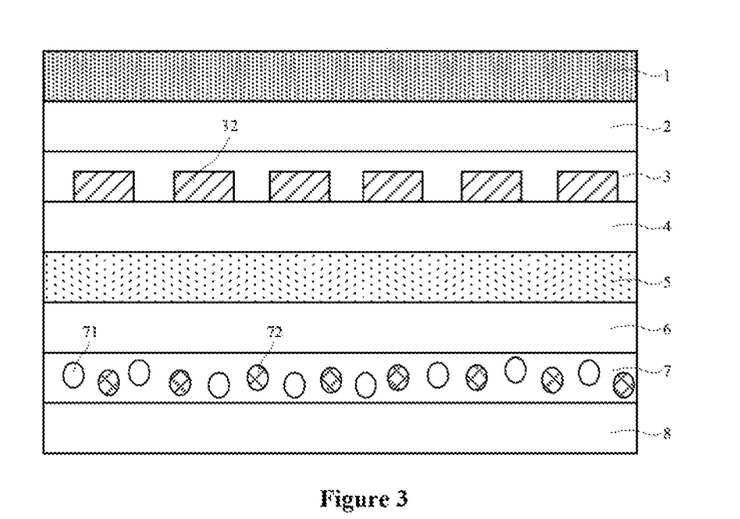
FIG. 3 illustrates another exemplary display device according to various disclosed embodiments of the present disclosure.
Figure 4:
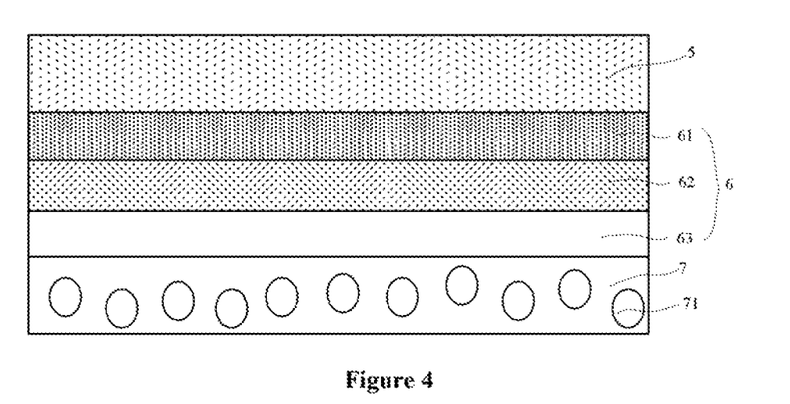
FIG. 4 illustrates certain layers in another exemplary display device according to various disclosed embodiments of the present disclosure.
Figure 5:
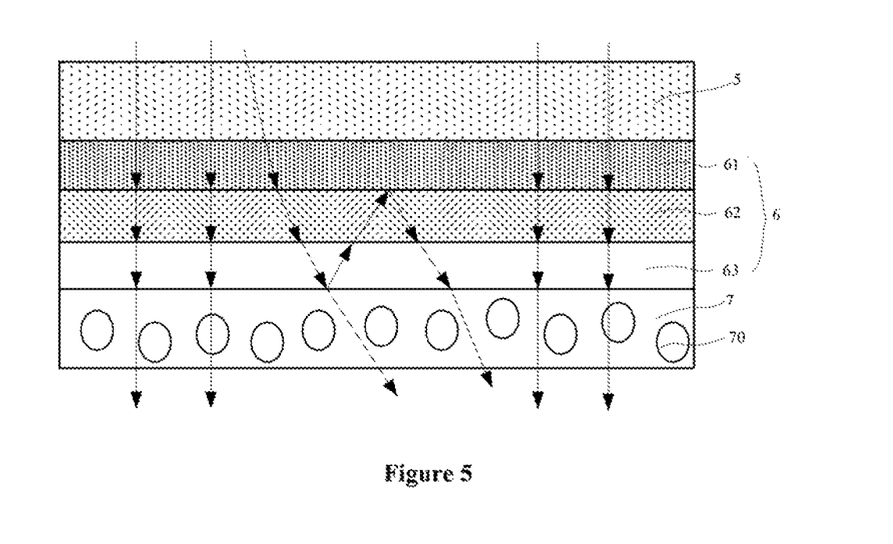
FIG. 5 illustrates the working principles of certain layers in the display device illustrated in FIG. 4.

For illustrative purposes, the disclosed display device is described using an organic light-emitting diode (OLED) device. In various embodiments, the display device may also be other suitable light-emitting devices or structures such as a light-emitting layer or OLEDs. FIGS. 1-3 each illustrates the structure of an exemplary OLED device provided by the present disclosure. FIG. 4 illustrates the structure of the OLED device shown in FIG. 1 with a dual brightness enhancement film. FIG. 5 illustrates the working principles of the OLED device illustrated in FIG. 4.

As shown in FIGS. 1-3, the present disclosure provides an OLED device. The OLED device may include a first electrode 5, an organic light-emitting layer 3, and a second electrode 1. The organic light-emitting layer 3 may be disposed between the first electrode 5 and the second electrode 1. The OLED device may also include a quantum dot sealant layer 7 disposed on the light-emitting side of the organic light-emitting layer 3. The second electrode 1 may be disposed on a non-light-emitting side of the OLED device. The quantum dot sealant layer 7 may include a plurality of quantum dots. The OLED device may further include a dual brightness enhancement film 6 disposed between the quantum dot sealant layer 7 and the organic light-emitting layer 3. The dual brightness enhancement film 6 may be configured to allow the light emitted by the organic light-emitting layer 3 to transmit through and may fully reflect the light emitted by the quantum dot sealant layer 7 from excitation. The organic light-emitting layer 3 may include a plurality of light-emitting units. The organic light-emitting layer 3 may include blue light-emitting units 31 and green light-emitting units 32 as shown in FIG. 1, may include only blue light-emitting units 31 as shown in FIG. 2, and may also include only green light-emitting units 32 as shown in FIG. 3. As shown in FIG. 1, the quantum dots 71 in the quantum dot sealant layer 7 may generate light of complementary colors when excited by the light emitted by the light-emitting units. The light of complementary colors may mix with the light emitted by the light-emitting units to form full-color light.

As shown in FIG. 1, the OLED device may include a quantum dot sealant layer 7 and a dual brightness enhancement film 6. By disposing quantum dots 71 in the quantum dot sealant layer 7, light of complementary colors may be generated by the quantum dots in the quantum dot sealant layer 7. Light-emitting units may be formed in the organic light-emitting layer 3. The light of complementary colors may mix with light emitted by the organic light-emitting layer 3 to form full-color light. For example, the blue light-emitting units 31 and the green light-emitting units 32 may emit light to excite the quantum dots, e.g., red quantum dots, in the quantum dot sealant layer 7. The quantum dots in the quantum dot sealant layer 7 may emit light of complementary colors, e.g., red light. The light of complementary colors, emitted by the quantum dots, may mix with the light emitted by the organic light-emitting layer 3 to form full-color light. The dual brightness enhancement film 6 may allow the light emitted by the organic light-emitting layer 3 to pass through and may fully reflect the light that is emitted by quantum dots in the quantum dot sealant layer 7 and radiating towards the organic light-emitting layer 3. That is, the dual brightness enhancement film 6 may fully reflect the light emitted by the quantum dots in the quantum dot sealant layer 7 and illuminating towards the organic light-emitting layer 3, so that the light emitted by the organic light-emitting layer 3 and the light of complementary colors emitted by the quantum dots 71 in the quantum dot layer 7 may fully transmit to the light-emitting side of the OLED device. Full-color light may be formed by the mixing of the light emitted by the organic light-emitting layer 3 and the light of complementary colors. The intensity and color saturation of the light at the light-emitting side of the OLED device may be improved. The light emission efficiency of the OLED device may also be improved.

In some embodiments, the light of complementary colors may include red light.

As shown in FIG. 1, because the light of complementary colors may include red light, the quantum dots 71 in the quantum dot sealant layer 7 may be used to emit red light. The light-emitting units disposed in the organic light-emitting layer 3 may include blue light-emitting units 31 and green light-emitting units 32, for emitting blue light and green light, respectively. The organic light-emitting layer 3 may not include red light-emitting units. Thus, issues such as short service time of the OLED device caused by short service time of red light-emitting materials in the organic light-emitting layer 3, may be reduced or eliminated. In certain other embodiments, red light-emitting units may also be included in the organic light-emitting layer 3, depending on the applications and designs.

In some embodiments, the light-emitting units in the organic light-emitting layer 3 may include at least one of green light-emitting units 32 and blue light-emitting units 31.

For example, as shown in FIG. 2, when the light-emitting units include only blue light-emitting units 31, the quantum dot sealant layer 7 may include red quantum dots 71 and green quantum dots 73. The red quantum dots 71 may generate red light when absorbing blue light. The green quantum dots 73 may generate green light when absorbing blue light.

In embodiments of the present disclosure, a red quantum dot refers to a quantum dot that emits red light. The red quantum dot may absorb any suitable light or electromagnetic waves with higher energy such as blue light or green light to emit red light. The absorbed light or electromagnetic waves may excite certain energy transitions in the red quantum dots for the emission of red light. The red quantum dots 71 in the same figure or in different may be made of a same material or different materials, depending on different applications and embodiments. When "red quantum dots" is mentioned, it refers to quantum dots that emit red light, regardless of the colors of light being absorbed. Similar definitions and requirements apply when referring to the green quantum dots and the blue quantum dots, and are not repeated herein.

Further, as shown in FIG. 3, when the light emitting units include only green light-emitting units 32, the quantum dot sealant layer 7 may include red quantum dots 71 and blue quantum dots 72. The red quantum dots 71 may generate red light when absorbing green light. The blue quantum dots 72 may generate blue light when absorbing green light.

As shown in FIG. 1, when the light-emitting units include only green light-emitting units 32 and blue light-emitting units 31, the quantum dot sealant layer 7 may include red quantum dots 71. The red quantum dots 71 may absorb at least one of blue light and green light to emit red light.

In practice, the quantum dot sealant layer 7 may have various different configurations.

One configuration may be exemplified in FIG. 2. In this case, the light-emitting units may include only blue light-emitting units 31. The quantum dot sealant layer 7 may include red quantum dots 71 and green quantum dots 73. When the blue light-emitting units 31 emit blue light, the red quantum dots 71 may absorb blue light to emit red light, and the green quantum dots 73 may absorb blue light to emit green light. The portion of blue light not absorbed by the quantum dots may transmit through the quantum dot sealant layer 7 and mix with the green light and red light emitted by the quantum dots, to generate full-color light.

Another configuration may be exemplified in FIG. 3. In this case, the light-emitting units may include only green light-emitting units 32. The quantum dot sealant layer 7 may include red quantum dots 71 and blue quantum dots 72. When the green light-emitting units 32 emit green light, the red quantum dots 71 may absorb green light to emit red light, and the blue quantum dots 7 may absorb green light to emit blue light. The portion of green light not absorbed by the quantum dots may transmit through the quantum dot sealant layer 7 and mix with the blue light and red light emitted by the quantum dots, to generate full-color light.

Another configuration may be exemplified in FIG. 1. In this case, the light-emitting units may include only green light-emitting units 32 and blue light-emitting units 31. The quantum dot sealant layer 7 may include red quantum dots 71. When the green light-emitting units 32 emit green light and the blue light-emitting units 31 emit blue light, the red quantum dots 71 may absorb blue light to emit red light. The portion of blue light not absorbed by the quantum dots and the green light may transmit through the quantum dot sealant layer 7 and mix with the red light emitted by the quantum dots, to generate full-color light.

In another configuration (not shown), the light-emitting units may include only green light-emitting units 32 and blue light-emitting units 31. The quantum dot sealant layer 7 may include red quantum dots 71. When the green light-emitting units 32 emit green light and the blue light-emitting units 31 emit blue light, the red quantum dots 71 may absorb green light to emit red light. The portion of green light not absorbed by the quantum dots and the blue light may transmit through the quantum dot sealant layer 7 and mix with the red light emitted by the quantum dots, to generate full-color light.

In another configuration (not shown), the light-emitting units may include only green light-emitting units 32 and blue light-emitting units 31. The quantum dot sealant layer 7 may include red quantum dots 71. When the green light-emitting units 32 emit green light and the blue light-emitting units 31 emit blue light, a portion of the red quantum dots 71 may absorb green light to emit red light, and another portion of the red quantum dots 71 may absorb green light to emit red light. The portion of green light and the portion of blue light not absorbed by the quantum dots may transmit through the quantum dot sealant layer 7 and mix with the red light emitted by the quantum dots, to generate full-color light.

In embodiments of the present disclosure, the light-emitting units disposed in the organic light-emitting layer 3 may include one or more of blue light-emitting units 31 and green light-emitting units 32. Red quantum dots 71, disposed in the quantum dot sealant layer 7, may absorb blue light or green light to emit red light. Thus, no red light-emitting units need to be formed in the OLED device for emitting red light. The red light emitted by the red quantum dots 71, and the green light and the blue light emitted by the organic light-emitting layer 3 or the quantum dot sealant layer 7, may mix and form full-color light. Issues such as short service time of the OLED device, caused by short service time of red light-emitting materials in the organic light-emitting layer 3, may be reduced or eliminated.

Optionally, in certain embodiments, red light-emitting units (not shown) may also be formed in the organic light-emitting layer 3 for emitting red light, depending on the applications.

In practice, the organic light-emitting layer 3 may include a plurality of pixel units. Each pixel unit may include a plurality of subpixel units. In some embodiments, a subpixel unit may include a blue light-emitting unit 31 or a green light-emitting unit 32. In certain embodiments, a subpixel unit may include a red light-emitting unit. The area of the quantum dot sealant layer 7 may cover the area of the organic light-emitting layer 3. One or more red quantum dots 71 may correspond to at least one subpixel unit in each pixel unit. In some embodiments, one or more green quantum dots 73, or one or more blue quantum dots 72 may correspond to at least one subpixel unit in a pixel unit.

For example, a pixel unit may include three subpixel units. The first subpixel unit in the pixel unit may include a blue light-emitting unit 31, the second subpixel unit in the pixel unit may include a green light-emitting unit 32, and the third subpixel unit in the pixel unit may include one of a green light-emitting unit 32 and a blue light-emitting unit 31. The quantum dot sealant layer 7 may include red quantum dots 71, each corresponding to a third subpixel unit. Accordingly, the red quantum dots 71 may absorb blue light and green light, and emit red light. Full-color light may be formed at the light-emitting side of the OLED device.

In another example, a pixel unit may include three subpixels, each subpixel including a blue light-emitting unit 31. The quantum dot sealant layer 7 may include red quantum dots 71 and green quantum dots 73. A red quantum dot 71 may correspond to one of the three subpixels in a pixel unit, and a green quantum dot 73 may correspond to another one of the three subpixels in the pixel unit. Accordingly, the red quantum dots 71 may absorb blue light and emit red light, and the green quantum dots 73 may absorb blue light and emit green light. Full-color light may be formed at the light-emitting side of the OLED device.

Similarly, the three subpixels in a pixel unit may each include a green light-emitting unit 32, and the quantum dot sealant layer 7 may include red quantum dots 71 and blue quantum dots 72. The working mechanism of the OLED in this configuration may be referred to the above-mentioned configuration, and details are not repeated herein.

In various configurations of the light-emitting units and the quantum dots, at locations in the quantum dot sealant layer 7 not disposed with quantum dots, light emitted by the corresponding light-emitting units in the organic light-emitting layer 3 may maintain the original color when passing through the quantum dot sealant layer 7.

It should be noted that, the terms "first", "second", "third", and the alike are only used to distinguish different subpixels in a pixel unit, and do not indicate any differences in the functions and structures of the subpixels.

Further, the dual brightness enhancement film 6 may include a light-refracting layer 61, a light-scattering layer 62, and a light-condensing layer 63. The light-refracting layer 61 may allow the light emitted by the organic light-emitting layer 3 to transmit through and may fully reflect the light emitted by the quantum dots in the quantum dot sealant layer 7. The light-scattering layer 62 may be disposed on the side of the light-refracting layer 61 that is facing away from the organic light-emitting layer 3. The light-scattering layer 62 may scatter the light transmitted through the light-refracting layer 61. The light-condensing layer 63 may be disposed on the side of the light-scattering layer 62 that is facing the quantum dot sealant layer 7. The light-condensing layer 63 may condense or focus the light transmitted through the light-scattering layer 62.

The working principles of the dual brightness enhancement film 6 may be illustrated in FIG. 5. Arrows represent light radiating in certain directions. A portion of the light emitted by the light-emitting units in the organic light-emitting layer 3 (not shown in FIG. 5) may sequentially pass through the first electrode 5, the dual brightness enhancement film 6, and the quantum dot sealant layer 7. The other portion of the light emitted by the light-emitting units in the organic light-emitting layer 3 may be reflected back by the quantum dot sealant layer 7. Meanwhile, the quantum dots 70 in the quantum dot sealant layer 7 may emit light radiating in various directions under the excitation of the light emitted by the light-emitting units. The portion of the light reflected by the quantum dot sealant layer 7, and the light emitted by the quantum dots 70 that radiates towards the first electrode 5 may transmit through the light-condensing layer 63 and the light-scattering layer 62 of the dual brightness enhancement film 6, and undergo a full reflection at the light-refracting layer 61 of the dual brightness enhancement film 6.

The portion of light reflected by the quantum dot sealant layer 7 to the dual brightness enhancement film 6 may undergo a full reflection to be transmitted back from the dual brightness enhancement film 6 to the quantum dot sealant layer 7. The portion of light reflected by the quantum dot sealant layer 7 and undergoing a full reflection at the light-refracting layer 61 may undergo scattering and refraction twice by the light-scattering layer 62 and the light-condensing layer 63, so that the optical path of this portion of light may be changed. Thus, the portion of light reflected by the quantum dot sealant layer 7 may transmit through the dual brightness enhancement film 6 and the quantum dot sealant layer 7 to exit from the OLED device. The intensity and color saturation of the light emitted at the light-emitting side of the OLED device may be improved. The light emission efficiency may be improved. For illustrative purposes, the quantum dots 70 may represent any suitable quantum dots, e.g., red quantum dots. In some embodiments, the dual brightness enhancement film 6 may be made of an organic material.

In some embodiments, as shown in FIG. 1, the side of the organic light-emitting layer 3 facing the first electrode 5 may be the light-emitting side of the organic light-emitting layer 3. The quantum dot sealant layer 7 may be disposed on the side of the first electrode 5 that is facing away from the organic light-emitting layer 3.

Because the first electrode 5 is disposed on the light-emitting side of the organic light-emitting layer 3, the first electrode 5 may be made of a transparent material for the light to pass through. For example, the first electrode may be made of a metal oxide. In some embodiments, the first electrode may be made of indium tin oxide (ITO). Meanwhile, because ITO is electrically conductive and optically transparent, the first electrode 5, made of ITO, may allow light emitted by the organic light-emitting layer 3 to pass through with high transmission rate. The light emission efficiency may be further improved.

Further, the dual brightness enhancement film 6 may be disposed between the quantum dot sealant layer 7 and the first electrode 5.

Referring to FIG. 5, as described in the working principles of the dual brightness enhancement film 6, by disposing the dual brightness enhancement film 6 between the quantum dot sealant layer 7 and the first electrode 5, light transmitting through the first electrode 5 may pass through the dual brightness enhancement film 6. Also, the dual brightness enhancement film 6 may enable the light emitted by the quantum dots to undergo a full reflection. Thus, the dual brightness enhancement film 6 may enable light transmitted through the first electrode 5 and light emitted by the quantum dots in the quantum dot sealant layer 7 after excitation to mix and exit from the light-emitting side of the OLED device. The intensities of the red, green, and blue light, and the color saturation of the light may be improved. The light emission efficiency may be further improved. Meanwhile, the driving voltage of the OLED device may be reduced and the power consumption for operating the OLED device may be reduced accordingly.

In some embodiments, the second electrode 1 may be made of a suitable metal. For example, the second electrode 1 may be made of silver. Because the second electrode 1, made of silver, may be optically reflective, the second electrode 1 may reflect the light emitted by the organic light-emitting layer 3. Light emitted by the organic light-emitting layer 3 may be more efficiently used. The intensities of the red, green, and blue light, and the color saturation of the light may be improved. The light emission efficiency may be further improved.

In some embodiments, the first electrode may be the anode of the OLED device, and the second electrode may be the cathode of the OLED device. In certain other embodiments, the first electrode may be the cathode of the OLED device, and the first electrode may be the anode of the OLED device.

Specifically, in some embodiments, an electron transport layer (ETL) and/or a hole injection layer (HIL) may be formed between the first electrode 5 and the second electrode 1. Referring to FIG. 1, an ETL 2 and an HIL 4 may be disposed between the first electrode 5 and the second electrode 1. The ETL 2 may be disposed between the second electrode 1 and the organic light-emitting layer 3. The HIL 4 may be disposed between the organic light-emitting layer 3 and the first electrode 5. The actual positions of the ETL 2 and the HIL 4 may be determined or adjusted according to different embodiments and applications.

The red quantum dots 71, the green quantum dots 73, and blue quantum dots 72 may each be made of one or more of a plurality of materials.

Specifically, the red quantum dots 71 may be made of one or more of ZnSSe, ZnSeTe, ZnSTe, CdSSe, CdSeTe, CdSTe, HgSSe, HgSeTe, HgSTe, ZnCdS, ZnCdSe, ZnCdTe, ZnHgS, ZnHgSe, ZnHgTe, CdHgS, CdHgSe, CdHgTe, ZnCdSSe, ZnHgSSe, ZnCdSeTe, ZnHgSeTe, CdHgSSe, CdHgSeTe, CdS, CdSe, CdTe, ZnS, ZnSe, and ZnTe.

The green quantum dots 73 may be made of one or more of ZnSSe, ZnSeTe, ZnSTe, CdSSe, CdSeTe, CdSTe, HgSSe, HgSeTe, HgSTe, ZnCdS, ZnCdSe, ZnCdTe, ZnHgS, ZnHgSe, ZnHgTe, CdHgS, CdHgSe, CdHgTe, ZnCdSSe, ZnHgSSe, ZnCdSeTe, ZnHgSeTe, CdHgSSe, CdHgSeTe, CdS, CdSe, CdTe, ZnS, ZnSe, and ZnTe.

The blue quantum dots 72 may be made of one or more of ZnSSe, ZnSeTe, ZnSTe, CdSSe, CdSeTe, CdSTe, HgSSe, HgSeTe, HgSTe, ZnCdS, ZnCdSe, ZnCdTe, ZnHgS, ZnHgSe, ZnHgTe, CdHgS, CdHgSe, CdHgTe, ZnCdSSe, ZnHgSSe, ZnCdSeTe, ZnHgSeTe, CdHgSSe, CdHgSeTe, CdS, CdSe, CdTe, ZnS, ZnSe, and ZnTe.

To protect the OLED device, in some embodiments, a protection layer 8, referring to FIG. 1, may be disposed on the side of the quantum dot sealant layer 7 facing away from the organic light-emitting layer 3. The protection layer 8 may be made of a transparent material. The protection layer 8 may protect the entire OLED panel from being damaged. The protection layer 8 may be, for example, a transparent glass substrate, or a transparent resin substrate.

It should be noted that, the organic light-emitting layer 3 exemplified in the present disclosure are only for illustrative purposes. In practice, the organic light-emitting layer 3 may also be any other suitable light-emitting layer 3 capable of emitting light of a desired color. The specific materials to form the light-emitting layer 3 and the specific color of light emitted by the light-emitting layer 3 should be determined according to different applications and should not be limited by the embodiments of the present disclosure.

Another aspect of the present disclosure provides a semiconductor device. The semiconductor device may incorporate one or more of the above-mentioned display devices. The semiconductor device according to the embodiments of the present disclosure can be used in any product with display functions such as a television, an electronic paper, a digital photo frame, a mobile phone, and a tablet computer. In some embodiments, the semiconductor device may be a display apparatus.

The present disclosure provides a display device. The display device may include a first electrode, an organic light-emitting layer, a second electrode, a quantum dot sealant layer disposed on the light-emitting side of the organic light-emitting layer, and a dual brightness enhancement film disposed between the quantum dot sealant layer and the organic light-emitting layer. The organic light-emitting layer may be positioned between the first electrode and the second electrode. The dual brightness enhancement film may be used to allow the light emitted by the organic light-emitting layer to pass through and enable the light emitted by the quantum dots in the quantum dot sealant layer to undergo a full reflection. The organic light-emitting layer includes a plurality of light-emitting units. The quantum dots formed in the quantum dot sealant layer may emit light of complementary colors when being excited by the light emitted by the light-emitting units. The light of complementary colors may mix with the light emitted by the light-emitting units to form full-color light.

By forming a quantum dot sealant layer and a dual brightness enhancement film in the disclosed display device, the quantum dots formed in the quantum dot sealant layer may emit light of complementary colors when being excited by the light emitted by the light-emitting units. The light of complementary colors, generated by the quantum dots, may mix with the light emitted by the light-emitting units to form full-color light. The dual brightness enhancement film may allow the light emitted by the organic light-emitting layer to pass through and enable the light emitted by the quantum dots in the quantum dot sealant layer that radiates towards the organic light-emitting layer, to undergo a full reflection. Thus, the dual brightness enhancement film may enable the light emitted by the quantum dots and radiating towards the organic light-emitting layer to undergo a full reflection. The light emitted by the organic light-emitting layer and the light of complementary colors, emitted by the quantum dots in the quantum dot sealant layer, may transmit to the light-emitting side of the display device. Therefore, light emitted from the disclosed display device may have improved intensity and color saturation. The light emission efficiency of the display device may be improved. Meanwhile, the driving voltage of the display device may be reduced and the power consumption for operating the display device may be reduced accordingly.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. A display device having a light-emitting side and a non-light-emitting side, comprising:
    a light-emitting layer;
    a quantum dot sealant layer on the light-emitting side of the display device, wherein the quantum dot sealant layer comprises red quantum dots for emitting red light; and
    a dual brightness enhancement film between the light-emitting layer and the quantum dot sealant layer, the dual brightness enhancement film being configured to allow light emitted by the light-emitting layer to pass through and fully reflect light emitted by the red quantum dots of the quantum dot sealant layer that radiates toward the light-emitting layer to the light-emitting side of the display device.

2. The display device according to claim 1, further comprising a first electrode and a substrate, wherein:
    the first electrode is on the non-light-emitting side, the substrate is on the light-emitting side, and the quantum dot sealant layer is between the light-emitting layer and the substrate.

3. The display device according to claim 2, wherein: the first electrode is made of a material that is optically transparent and electrically conductive.

4. The display device according to claim 1, wherein:
    the light-emitting layer comprises at least one blue light-emitting units for emitting blue light and at least one green light-emitting units for emitting green light, the blue light, the green light, and the red light forming full-color light on the light-emitting side.

5. The display device according to claim 4, wherein:
    the quantum dot sealant layer covers the light-emitting layer.

6. The display device according to claim 4, wherein:
    the red quantum dots absorb at least one of blue light and green light for emitting red light.

7. The display device according to claim 1, wherein:
    the light-emitting layer comprises at least one blue light-emitting unit for emitting blue light; and
    the quantum dot sealant layer further comprises green quantum dots for emitting green light, the blue light, the green light, and the red light forming full-color light on the light-emitting side.

8. The display device according to claim 7, wherein:
    the green quantum dots absorb blue light to emit green light; and
    the red quantum dots absorb at least blue light for emitting red light.

9. The display device according to claim 1, wherein:
    the light-emitting layer comprises at least one green light-emitting unit for emitting green light; and
    the quantum dot sealant layer further comprises blue quantum dots for emitting blue light, the blue light, the green light, and the red light forming full-color light on the light-emitting side.

10. The display device according to claim 8, wherein:
    the blue quantum dots absorb green light to emit blue light; and
    the red quantum dots absorb at least green light for emitting red light.

11. The display device according to claim 1, wherein the dual brightness enhancement film comprises a light-refracting layer, a light-scattering layer, and a light-condensing layer, wherein:
    the light-refracting layer transmits the light emitted by the light-emitting layer through and fully reflects the light emitted by the red quantum dots of the quantum dot sealant layer;
    the light-scattering layer scatters light transmitted through the light-refracting layer, the light-scattering layer being disposed on a side of the light-refracting layer that is facing away from the light-emitting layer; and
    the light-condensing layer condenses light transmitted through the light-scattering layer, the light-condensing layer being disposed on a side of the light-scattering layer that is facing the quantum dot sealant layer.

12. The display device according to claim 1, wherein the light-emitting layer is made of an organic light-emitting material.

13. The display device according to claim 1, wherein: the light-emitting layer is made of an inorganic light emitting material.

14. The display device according to claim 1, wherein light emitted by a light-emitting unit and transmitting through a corresponding location of the quantum dot sealant layer without a quantum dot maintains color when passing through the quantum dot sealant layer.

15. The display device according to claim 1, wherein: the red quantum dots are made of one or more of:
    ZnSSe, ZnSeTe, ZnSTe, CdSSe, CdSeTe, CdSTe, HgSSe, HgSeTe, HgSTe, ZnCdS, ZnCdSe, ZnCdTe, ZnHgS, ZnHgSe, ZnHgTe, CdHgS, CdHgSe, CdHgTe, ZnCdSSe, ZnHgSSe, ZnCdSeTe, ZnHgSeTe, CdHgSSe, CdHgSeTe, CdS, CdSe, CdTe, ZnS, ZnSe, or ZnTe.

16. The display device according to claim 1, wherein: the green quantum dots are made of one or more of:
    ZnSSe, ZnSeTe, ZnSTe, CdSSe, CdSeTe, CdSTe, HgSSe, HgSeTe, HgSTe, ZnCdS, ZnCdSe, ZnCdTe, ZnHgS, ZnHgSe, ZnHgTe, CdHgS, CdHgSe, CdHgTe, ZnCdSSe, ZnHgSSe, ZnCdSeTe, ZnHgSeTe, CdHgSSe, CdHgSeTe, CdS, CdSe, CdTe, ZnS, ZnSe, or ZnTe.

17. The display device according to claim 1, wherein the dual brightness enhancement film is made of an organic material.

18. A semiconductor device, comprising one or more of the display devices according to claim 1.

19. The display device according to claim 1, wherein the light-emitting layer includes at least one green light-emitting unit to emit green light.

* * * * *